US011232994B2

United States Patent
Tsuyuno et al.

(10) Patent No.: US 11,232,994 B2
(45) Date of Patent: Jan. 25, 2022

(54) POWER SEMICONDUCTOR DEVICE HAVING A DISTANCE REGULATION PORTION AND POWER CONVERSION APPARATUS INCLUDING THE SAME

(71) Applicant: Hitachi Automotive Systems, Ltd., Hitachinaka (JP)

(72) Inventors: Nobutake Tsuyuno, Tokyo (JP); Hiromi Shimazu, Tokyo (JP); Akihiro Namba, Tokyo (JP); Akira Matsushita, Hitachinaka (JP); Hiroshi Houzouji, Hitachinaka (JP); Atsuo Nishihara, Tokyo (JP); Toshiaki Ishii, Tokyo (JP); Takashi Hirao, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 33 days.

(21) Appl. No.: 16/627,081

(22) PCT Filed: May 22, 2018

(86) PCT No.: PCT/JP2018/019581
§ 371 (c)(1),
(2) Date: Dec. 27, 2019

(87) PCT Pub. No.: WO2019/003718
PCT Pub. Date: Jan. 3, 2019

(65) Prior Publication Data
US 2020/0227333 A1      Jul. 16, 2020

(30) Foreign Application Priority Data
Jun. 30, 2017   (JP) .............................. JP2017-128208

(51) Int. Cl.
*H01L 23/36* (2006.01)
*H01L 25/07* (2006.01)
(Continued)

(52) U.S. Cl.
CPC .............. *H01L 23/36* (2013.01); *H01L 25/07* (2013.01); *H01L 25/18* (2013.01); *H02M 7/48* (2013.01)

(58) Field of Classification Search
CPC ......... H01L 23/36; H01L 25/07; H01L 25/18; H01L 23/49531; H01L 23/49527;
(Continued)

(56) References Cited

U.S. PATENT DOCUMENTS 6,845,012 B2 *   1/2005   Ohkouchi ............. H01L 23/473
                                                          361/704
2009/0166850 A1 *  7/2009   Jeon ................... H01L 23/49562
                                                          257/706
(Continued)

FOREIGN PATENT DOCUMENTS

JP    2011-233606 A    11/2011
JP    2012-257369 A    12/2012
JP    2017-11922 A     1/2017

OTHER PUBLICATIONS

International Search Report (PCT/ISA/210) issued in PCT Application No. PCT/JP2018/019581 dated Aug. 21, 2018 with English translation (four (4) pages).
(Continued)

*Primary Examiner* — Alexander O Williams
(74) *Attorney, Agent, or Firm* — Crowell & Moring LLP (57) ABSTRACT

A power semiconductor device includes a circuit body, first and second insulations, first and second bases, a case, and a distance regulation portion. The circuit body incudes a semiconductor element and a conductive portion. The first insulation and the second insulation oppose each other. The first base and second base also oppose each other. The case has a first opening portion covered with the first base and a second opening portion covered with the second base. The distance regulation portion has a first end that contacts the
(Continued)

first base and a second end, that is opposite to the first end, and that contacts the second base. The distance regulation portion regulates a distance between the first base and the second base.

9 Claims, 11 Drawing Sheets

(51) Int. Cl.
    *H01L 25/18*     (2006.01)
    *H02M 7/48*     (2007.01)

(58) Field of Classification Search
CPC ............... H01L 23/49; H01L 23/49503; H01L 23/49537; H01L 23/4334; H01L 34/367; H01L 2224/45124; H01L 2224/33181; H01L 25/072; H01L 2224/48227; H01L 24/40; H01L 24/48; H01L 2224/40137; H01L 24/45; H01L 24/06; H01L 2924/181; H01L 2224/0603; H01L 2924/00012; H01L 2924/00014; H02M 7/48; H02M 7/003; H02M 3003/327
USPC ........................................................ 257/706
See application file for complete search history.

(56) References Cited

U.S. PATENT DOCUMENTS

| | | |
|---|---|---|
| 2013/0062751 A1 | 3/2013 | Takagi et al. |
| 2014/0098588 A1 | 4/2014 | Kaneko et al. |
| 2017/0178998 A1* | 6/2017 | Jeun ................. H01L 23/49562 |
| 2019/0006255 A1* | 1/2019 | Suwa ................ H01L 23/49524 |

OTHER PUBLICATIONS

Japanese-language Written Opinion (PCT/ISA/237) issued in PCT Application No. PCT/JP2018/019581 dated Aug. 21, 2018 (four (4) pages).

* cited by examiner

POWER SEMICONDUCTOR DEVICE HAVING A DISTANCE REGULATION PORTION AND POWER CONVERSION APPARATUS INCLUDING THE SAME

RELATED APPLICATIONS

This application is a national stage entry of PCT International Application PCT/JP2018/019581 filed May 22, 2018, which claims priority under 35 U.S.C. § 119 from Japanese Patent Application No. JP 2017-128208 filed Jun. 30, 2017, the entire disclosures of which are herein expressly incorporated by reference.

TECHNICAL FIELD

The present invention relates to a power semiconductor device equipped with a power semiconductor element and a power conversion apparatus including the power semiconductor device.

BACKGROUND ART

An apparatus that converts power with the switching of a power semiconductor element, has high conversion efficiency, and thus is widely used for general purposes, for vehicles, for railways, or for electric substation equipment. Because such a power semiconductor element generates heat due to energization, high heat dissipation is required. Particularly, for vehicles, a high-efficiency cooling system with a liquid coolant, enabling miniaturization and weight reduction, has been adopted. For example, PTL 1 discloses a power module to be used for a power conversion apparatus, in which a resin-molded semiconductor device is housed in a case.

CITATION LIST

Patent Literature

PTL 1: JP 2011-233606 A

SUMMARY OF INVENTION

Technical Problem

The power module described in PTL 1 includes a sealing body sealing a semiconductor element, housed in a case having a thin-walled portion surrounding heat-dissipation plates. After crimping of the sealing body and the case, a process of sealing the space between the sealing body and the case, with a potting resin is required.

An object of the present invention is to provide a power semiconductor device enabling improvement in productivity without deterioration in reliability.

Solution to Problem

According to the present invention, provided are: a circuit body including a semiconductor element and a conductive portion; a first insulation and a second insulation opposed to each other, the circuit body being interposed between the first insulation and the second insulation; a first base and a second base opposed to each other, the circuit body, the first insulation, and the second insulation being interposed between the first base and the second base; a case having a first opening portion covered with the first base and a second opening portion covered with the second base; and a distance regulation portion provided in space between the first base and the second base, the distance regulation portion regulating a distance between the first base and the second base in contact with the first base and the second base.

Advantageous Effects of Invention

According to the present invention, the power semiconductor device enables improvement in productivity without deterioration in reliability.

DESCRIPTION OF EMBODIMENTS

As an embodiment of a structure according to the present invention, a power semiconductor device for a power conversion apparatus to be equipped in a vehicle, will be described below. In an embodiment of the power semiconductor device to be described below, constituent elements will be described with reference to the drawings, such as a power semiconductor element as a heating element, a conductive portion to be equipped with the power semiconductor element, a base having a fin portion as a heat-dissipation plate for thermal connection with the heating element, and a sealant resin as a resin material for securing the heating element and the heat-dissipation plate. Note that the same elements in the figures are denoted with the same reference signs, and thus the duplicate descriptions thereof will be omitted.

Figure 1:
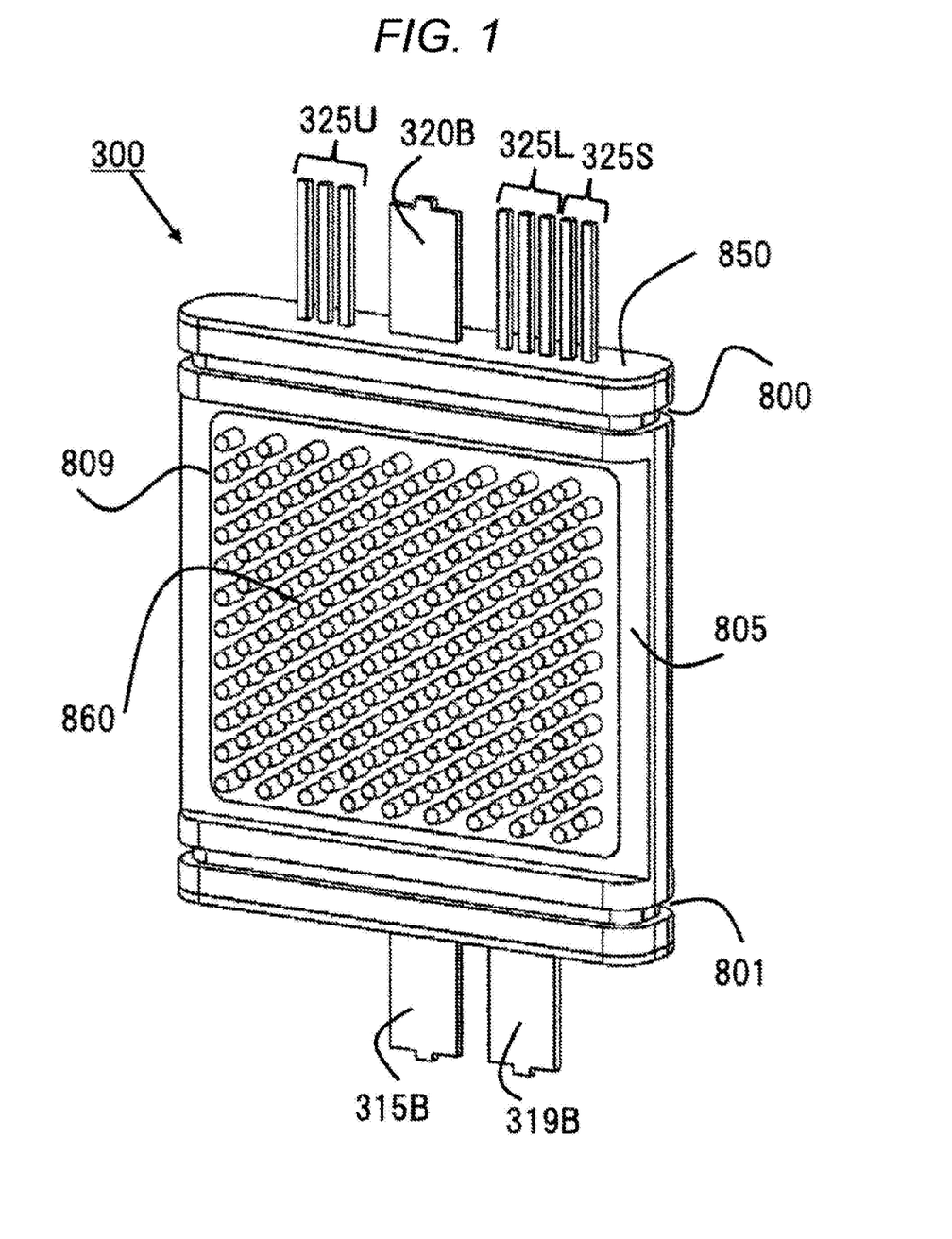
FIG. 1 is a perspective view of the entirety of a power semiconductor device 300 according to the present embodiment.

FIG. 1 is a perspective view of the entirety of a power semiconductor device 300 according to the present embodiment. The power semiconductor device 300 includes a metallic case 805, a metallic base 860 having a heat-dissipation fin, a sealant resin 850 housed in the case 805, a direct-current terminal 315B, a direct-current terminal 319B, an alternating-current terminal 320B, a signal terminal 325U, a signal terminal 325L, and a signal terminal 325S.

The signal terminal 325U transmits a signal to a power semiconductor element in the upper arm of an inverter circuit. The signal terminal 325L transmits a signal to a power semiconductor element in the lower arm of the inverter circuit. The signal terminal 325S has a terminal for current detection and a terminal for temperature detection.

The case 805 forms a sealing portion 800 formed near an opening through which, for example, the alternating-current terminal 320B penetrates and a sealing portion 801 formed near an opening through which the direct-current terminal 315B and the direct-current terminal 319B penetrate. A welded portion 809 is provided at the boundary portion between the case 805 and the base 860.

Cooling water comes in contact with the region interposed between the sealing portion 800 and the sealing portion 801 in the case 805. The cooling water is isolated from the sealant resin 850 by the metallic materials of the case 805, the base 860, and the welded portion 809.

This arrangement enables prevention of the sealant resin 850 from absorbing moisture due to the cooling water, so that high reliability can be maintained. The signal terminal 325L, the signal terminal 325U, the signal terminal 325S, and the alternating-current terminal 320B protrude in a line from one face of the power semiconductor device 300. These terminals protruding, for connection to a control circuit, a driver circuit, and a current sensor, from the one face, enables effective simplification in inverter layout.

The direct-current terminal 315B and the direct-current terminal 319B protrude in a line from one face of the power semiconductor device 300. Because the direct-current terminal 315B and the direct-current terminal 319B are adjacent to each other, input current and output current come close to each other, resulting in effective reduction of inductance. The direct-current terminal 315B and the direct-current terminal 319B protruding, for connection with a capacitor module coupled to a battery, from the one face, enables effective simplification in inverter layout.

Figure 2:
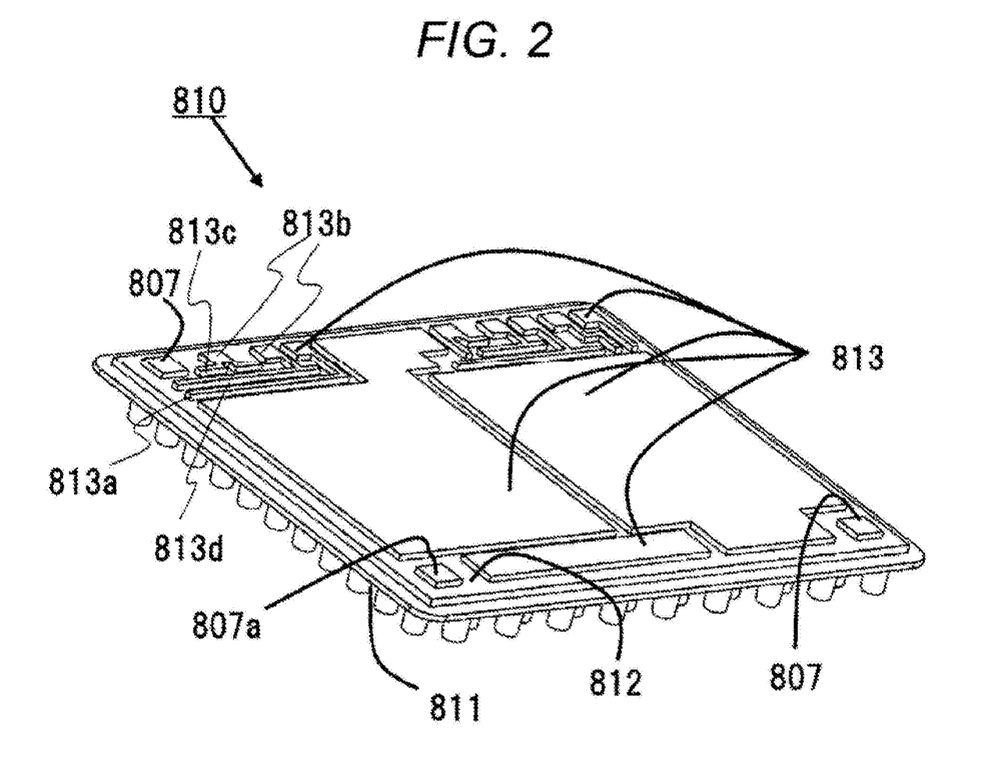
FIG. 2 is a perspective view of a collector-side substrate 810 for the power semiconductor device 300.

FIG. 2 is a perspective view of a collector-side substrate 810 for the power semiconductor device 300.

A conductive portion 813 has an element equipment portion to be equipped with the power semiconductor elements and a terminal equipment portion to be equipped with, for example, the direct-current terminal 315B. A first base 811 is a metallic member forming a fin. A first insulation 812 formed between the conductive portion 813 and the first base 811, insulates the conductive portion 813 from the first base 811. The first insulation 812 is provided with distance regulation portions 807a to 807c to be described later.

The first base 811 is not particularly limited as long as being made of metallic material. From the viewpoint of heat dissipation, desirably, the first base 811 is made of copper or aluminum. Furthermore, in consideration of weldability with the case 805 illustrated in FIG. 1, most desirably, the first base 811 is made of aluminum.

Because the fin of the first base 811 is to be in contact with cooling water, from the viewpoint of anticorrosion action, desirably, the fin of the first base 811 is processed such that the outermost surface thereof is made of aluminum, alumite, or nickel.

The conductive portion 813 is not particularly limited as long as being made of material having electrical conductivity. Desirably, the conductive portion 813 is made of copper or aluminum that has excellent electrical conductivity. For improvement of solder connectivity, desirably, part or the entirety of the conductive portion 813 is nickelized. For improvement of adhesion to the sealant resin 850, desirably, the conductive portion 813 is processed by, for example, roughening.

A conductive portion 813a is to be connected to the gate electrode of a power semiconductor element through an Al wire not illustrated. A conductive portion 813b is to be connected to the signal terminal 325U illustrated in FIG. 1. Coupling of the conductive portion 813a and the conductive portion 813b enables miniaturization of the collector-side substrate 810.

In this case, flowing of a junction member for connection of the conductive portion 813b and the signal terminal 325U to the conductive portion 813a causes the Al wire to be difficult to connect. Thus, the width of the conductive portion 813a is formed smaller than the width of the conductive portion 813b. This arrangement inhibits the junction material for connection of the signal terminal 325U, from flowing to the conductive portion 813a to be connected with the Al wire.

A conductive portion 813c and a conductive portion 813d are connected to the conductive portion 813b. That is the conductive portion 813b branches into the plurality of conductive portions 813c and 813d. Particularly, the conductive portion 813c and the conductive portion 813d are formed apart from each other.

This arrangement prevents Al wires from crossing three-dimensionally in a case where two power semiconductor elements are equipped in parallel, and prevents a short circuit due to wire deformation at transfer molding.

The first insulation 812 is not particularly limited as long as being made of insulating material. From the viewpoint of thermal resistance and thermal conductivity, desirably, the first insulation 812 is made of ceramic. In a case where the first insulation 812 is made of ceramic, for improvement of adhesion to the sealant resin 850, desirably, for example, surface roughening is performed by a laser or an organic thin film is formed.

For example, the first base 811 and the conductive portion 813 are to be connected to the first insulation 812 through brazing material, or are to be connected to the first insulation 812 by pattern formation. More specifically, the first base 811 and the conductive portion 813 may be formed on both faces of the first insulation 812 by molten aluminum. Before assembly of the power semiconductor device 300, the first base 811 and the conductive portion 813 adhere to the first insulation 812, so that an adhesion process can be omitted in a process of assembling the power semiconductor device 300, resulting in a reduction in manufacturing cost.

Figure 3:
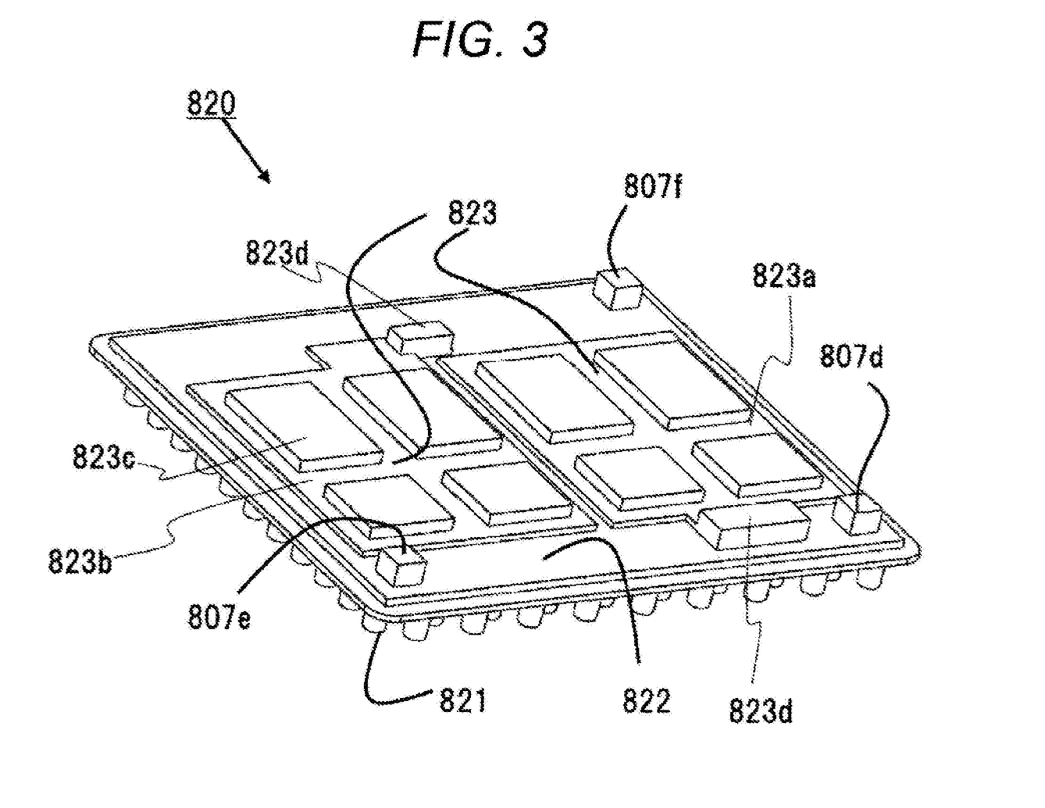
FIG. 3 is a perspective view of an emitter-side substrate 820 for the power semiconductor device 300.

FIG. 3 is a perspective view of an emitter-side substrate 820 for the power semiconductor device 300.

A conductive portion 823 is to be equipped with the power semiconductor elements. According to the present embodiment, a conductive portion 823a is to be equipped with two IGBTs and two diodes in the upper arm of the inverter circuit. A conductive portion 823b is to be equipped with two IGBTs and two diodes in the lower arm of the inverter circuit.

A second base 821 having a fin includes a metallic member. A second insulation 822 formed between the conductive portion 823 and the second base 821, insulates the conductive portion 823 from the second base 821.

The second insulation 822 is provided with distance regulation portions 807d to 807f to be described later.

The conductive portion 823 has a first projection 823c for connection with the emitter side of a power semiconductor element and a second projection 823d for connection with the wiring of the collector-side substrate 810. This arrangement enables a junction member to have a uniform thickness at the electrical connection between the collector-side substrate 810 and the emitter-side substrate 820 and enables inhibition of inclination due to connection, so that parallelism is more likely to be effectively maintained.

Figure 4:
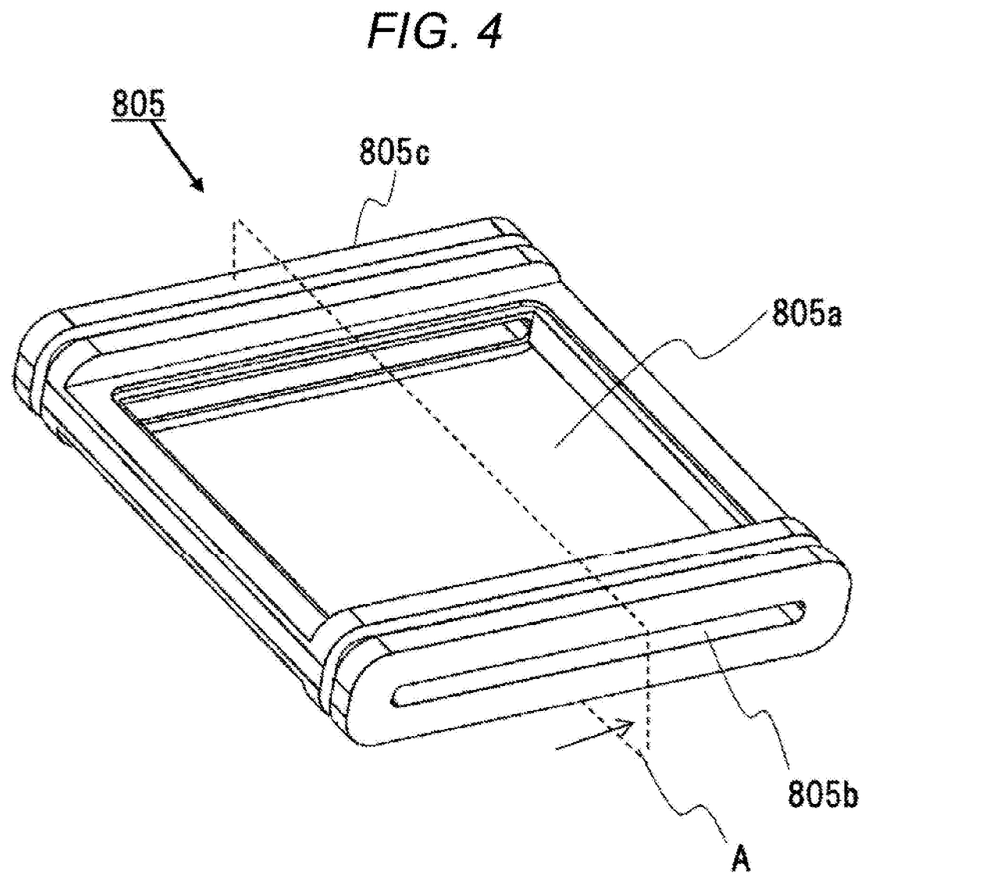
FIG. 4 is a perspective view of a case 805 according to the present embodiment.

FIG. 4 is a perspective view of the case 805 according to the present embodiment. The case 805 has a through hole 805a for insertion of the collector-side substrate 810 and the emitter-side substrate 820, a through hole 805b for insertion of, for example, the direct-current terminal 315B, and a through hole 805c for insertion of, for example, the alternating-current terminal 320B.

The case 805 is not particularly limited as long as being made of metallic material having waterproofness. In consideration of processability and weldability with the base, most desirably, the case 805 is made of aluminum.

A process of manufacturing the power semiconductor device 300 according to the present embodiment, will be described with FIGS. 5 to 8.

Figure 5A:
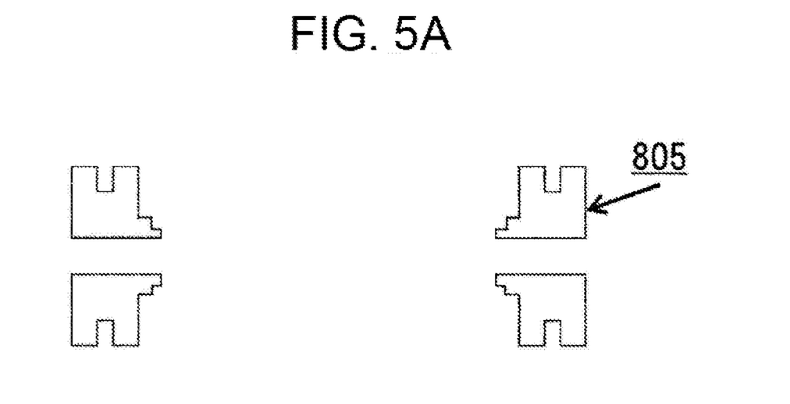
FIG. 5A is a sectional view of the case 805 when plane A of FIG. 4 is viewed in the direction of an arrow.

FIG. 5(a) is a sectional view of the case 805 when plane A of FIG. 4 is viewed in the direction of an arrow.

Figure 5B:
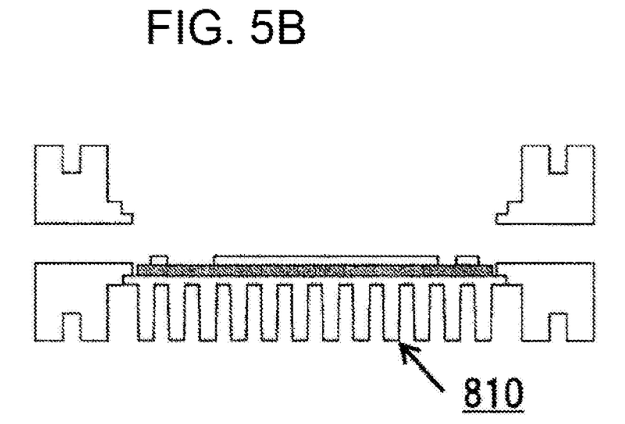
FIG. 5B is a sectional view of the case 805 equipped from below with the collector-side substrate 810.

FIG. 5(b) is a sectional view of the case 805 equipped from below with the collector-side substrate 810.

Figure 5C:
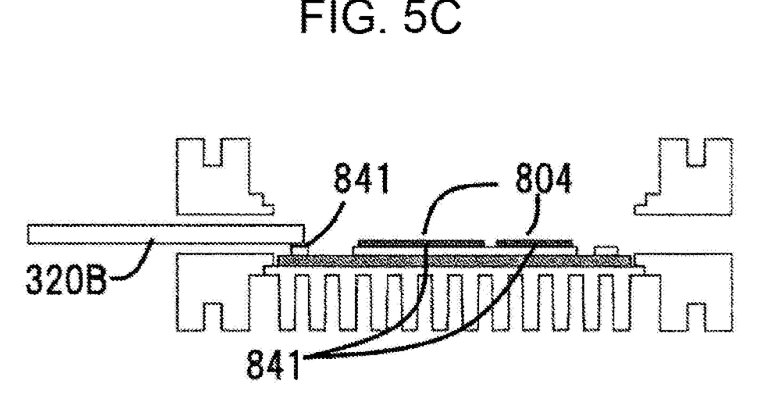
FIG. 5C is a sectional view of the collector-side substrate 810 equipped with part of circuit components.

FIG. 5(c) is a sectional view of the collector-side substrate 810 equipped with part of circuit components.

A connection member 841 is provided at the conductive portion 813 of the collector-side substrate 810. Furthermore, power semiconductor elements 804 and a terminal such as the alternating-current terminal 320B are connected to the conductive portion 813 through the connection member 841. After that, Al wires not illustrated are connected between the conductive portion 813 and the power semiconductor elements 804.

Figure 5D:
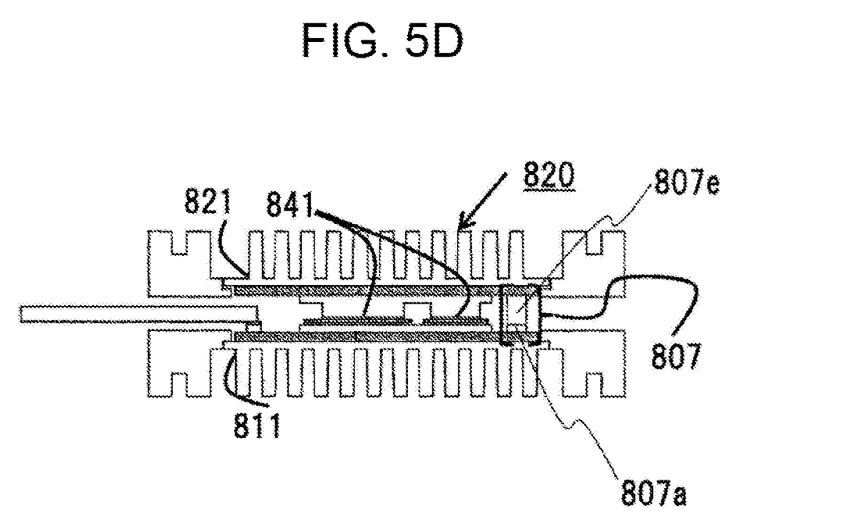
FIG. 5D is a sectional view of the case 805 equipped from below with the emitter-side substrate 820.

FIG. 5(d) is a sectional view of the case 805 equipped from below with the emitter-side substrate 820. In this case, the respective top faces of the distance regulation portion 807a and the distance regulation portion 807e are in contact. This arrangement enables the first base 811 and the second base 821 not to interfere in height with the case 805, so that the first base 811, the second base 821, and the case 805 can be prevented from interfering.

Then, because interference with the case 805 can be prevented at connection through the connection member 841, the electrical connection can be improved in quality. The first base 811 and the second base 821 are precisely regulated in height, so that the dimensions necessary for welding between the first base 811, the second base 821, and the base 805 can be maintained.

Figure 6A:
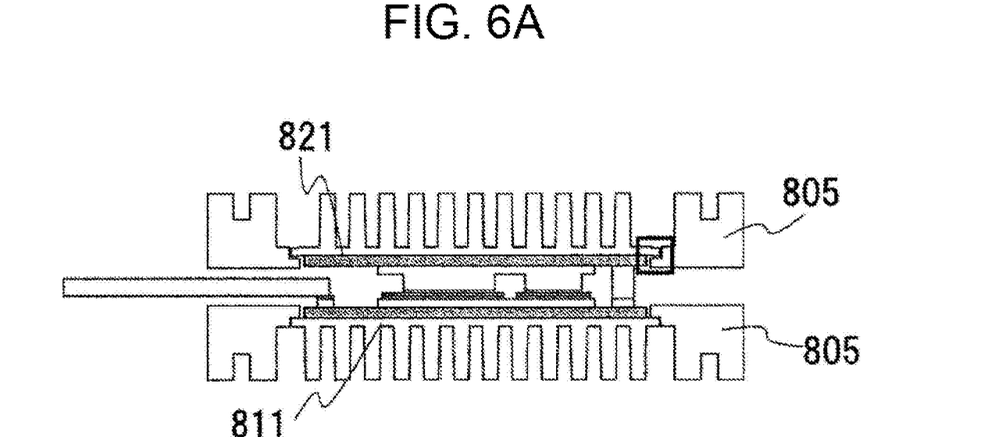
FIG. 6A is a sectional view of a processing process of a second base 821.
Figure 6B:
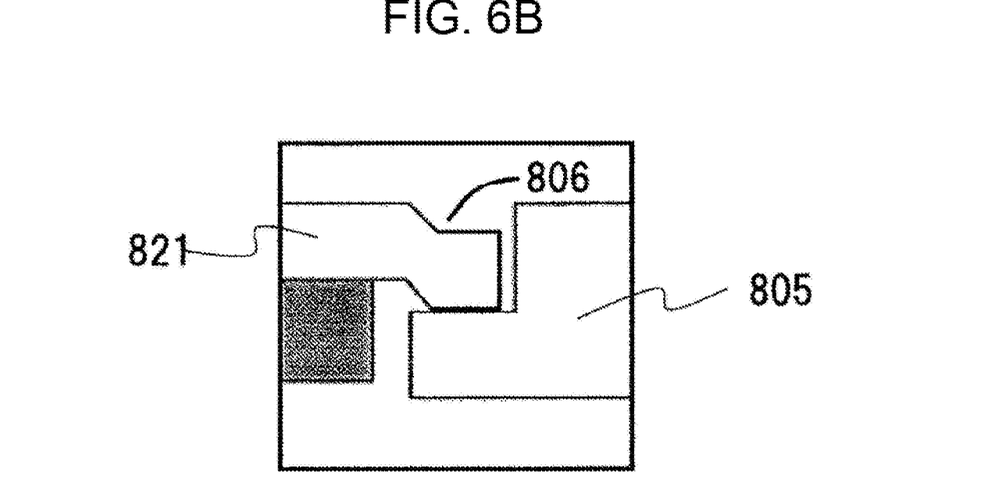
FIG. 6B is an enlarged sectional view of a processed portion of FIG. 6(a).

FIG. 6(a) is a sectional view of a processing process of the second base 821. FIG. 6(b) is an enlarged sectional view of a processed portion of FIG. 6(a).

The second base 821 does not interfere in height with the case 805. Thus, a bent portion 806 is provided to the second base 821, so that the circumferential edge of the second base 821 is close to the case 805.

Note that the first base 811 and the case 805 are in contact with each other due to the self-weight of the case 805 to the first base 811.

Figure 6C:
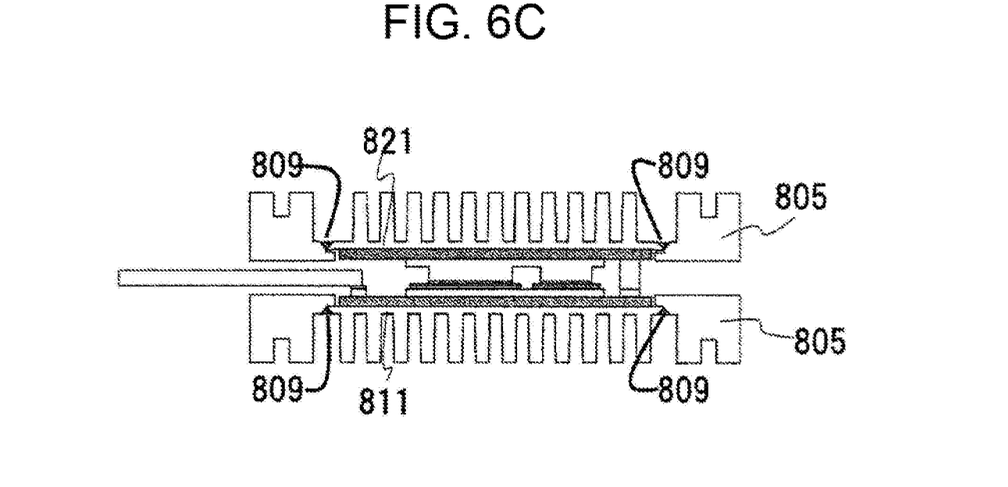
FIG. 6C is a sectional view of a laser welding process.

FIG. 6(c) is a sectional view of a laser welding process. The first base 811 and the case 805 are connected by laser welding and furthermore the second base 821 and the case 805 are connected by laser welding, so that respective welded portions 809 are formed.

Figure 6D:
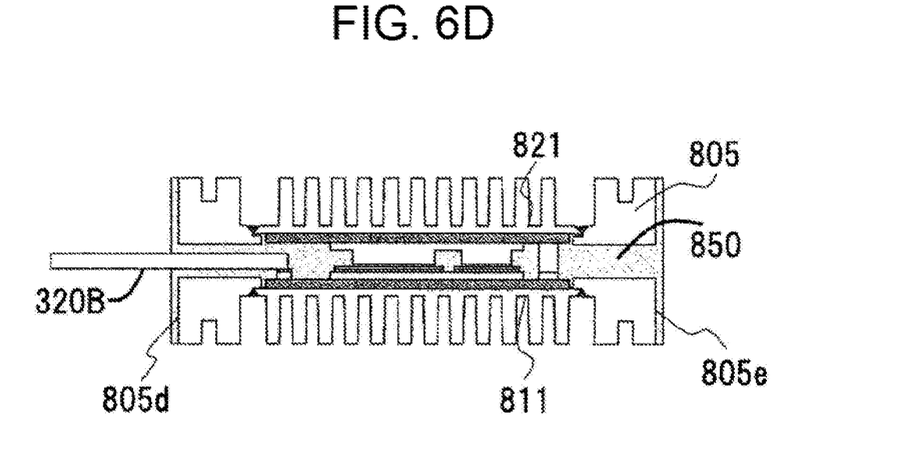
FIG. 6D is a sectional view of a resin sealing process by transfer molding.

FIG. 6(d) is a sectional view of a resin sealing process by transfer molding. The sealant resin 850 is sealed in the gap between the case 805, the first base 811, and the second base 821, by transfer molding.

Because the case 805 and the first base 811 are welded and furthermore the case 805 and the second base 821 are welded, the sealant resin 850 does not flow to the fin sides. Covering of end faces 805d and 805e of the case 805 with the sealant resin 850 enables insulation of a terminal such as the alternating-current terminal 320B, from the case 805. After that, tie bars in a lead frame not illustrated are cut to form the terminals, so that the power semiconductor device 300 is acquired.

Figure 7:
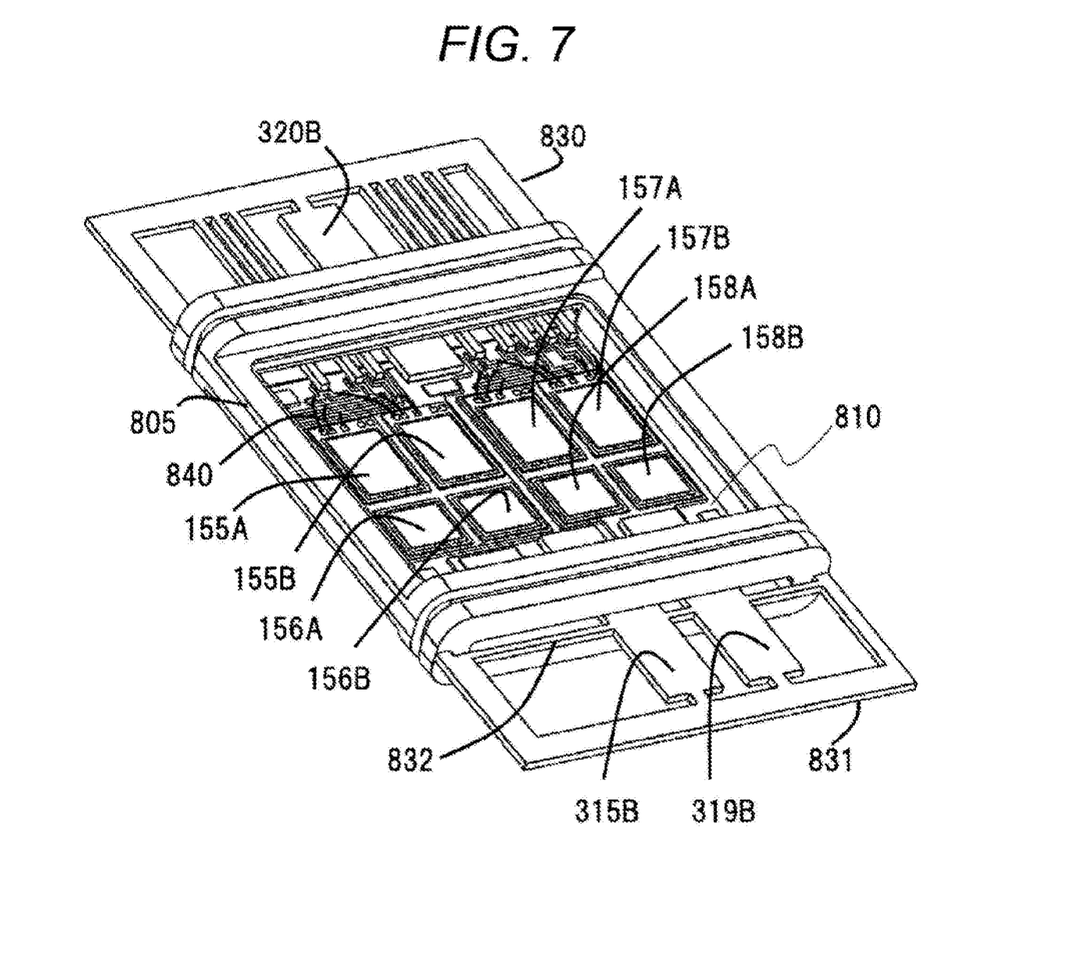
FIG. 7 is a perspective view of the midstream of a process of manufacturing the power semiconductor device 300 corresponding to the process of FIG. 5(c).

FIG. 7 is a perspective view of the midstream of the process of manufacturing the power semiconductor device 300 corresponding to the process of FIG. 5(c).

Figure 8:
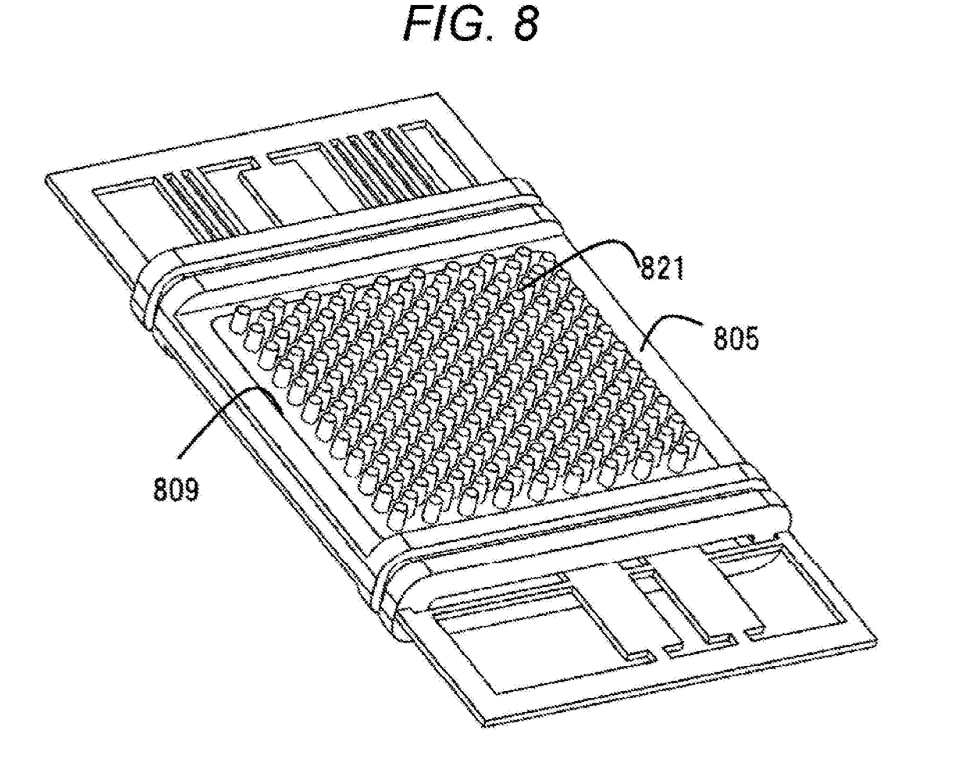
FIG. 8 is a perspective view of the midstream of the process of manufacturing the power semiconductor device 300 corresponding to the process of FIG. 6(c).

As the power semiconductors on the collector-side substrate 810, IGBTs 155A and 155B on the upper arm side, diodes 156A and 156B on the upper arm side, IGBTs 157A and 157B on the lower arm side, and diodes 158A and 158B on the lower arm side are connected through solder in two parallel lines. Here, IGBT is an abbreviation for insulated gate bipolar transistor. Each, such as the IGBT 155A, is connected to, for example, the conductive portion 813b of the collector-side substrate 810 through Al wires 840 from a gate and a temperature sense. Tie bars 830 to 832 make connections between the terminals, such as the alternating-current terminal 320B. FIG. 8 is a perspective view of the midstream of the process of manufacturing the power semiconductor device 300 corresponding to the process of FIG. 6(c).

The welded portion 809 is provided at the boundary portion at which the second base 821 and the case 805 are in contact. Because the case 805, the first base 811, and the second base 821 are welded, the sealant resin is prevented from absorbing moisture due to cooling water, so that high reliability can be maintained.

Figure 9A:
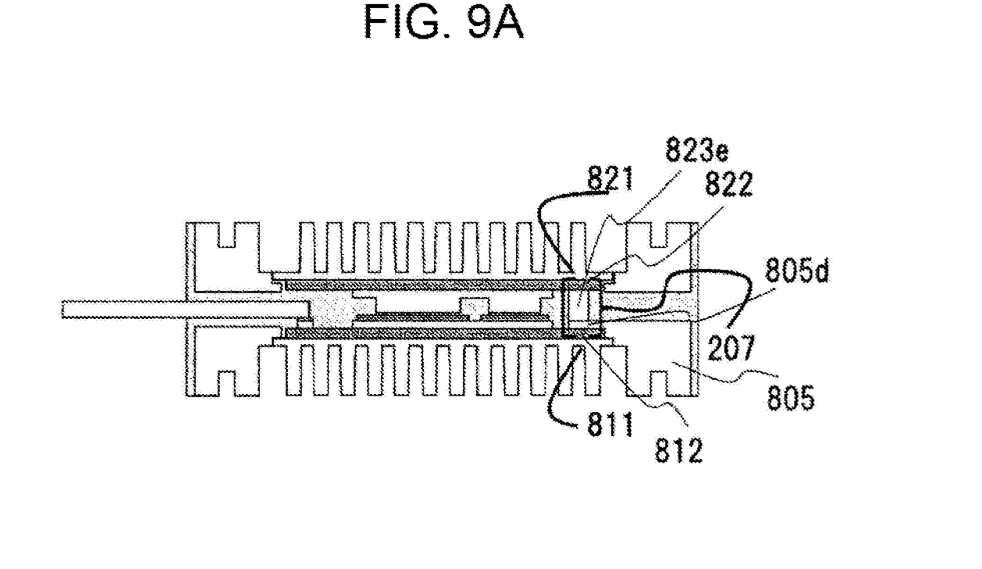
FIG. 9A is a sectional view of a power semiconductor device according to another embodiment.

FIG. 9(a) is a sectional view of a power semiconductor device according to another embodiment. The distance between a first base 811 and a second base 821 can be constantly retained by a distance regulation portion 207.

The distance regulation portion 207 according to the present embodiment is formed of a first insulation 812, a spacer 805d extending from part of a case 805, a conductive portion 823e formed at a second insulation 822, and the second insulation 822. The conductive portion 823e protrudes closer to the first insulation 812 than, for example, another conductive portion 823a does.

Figure 9B:
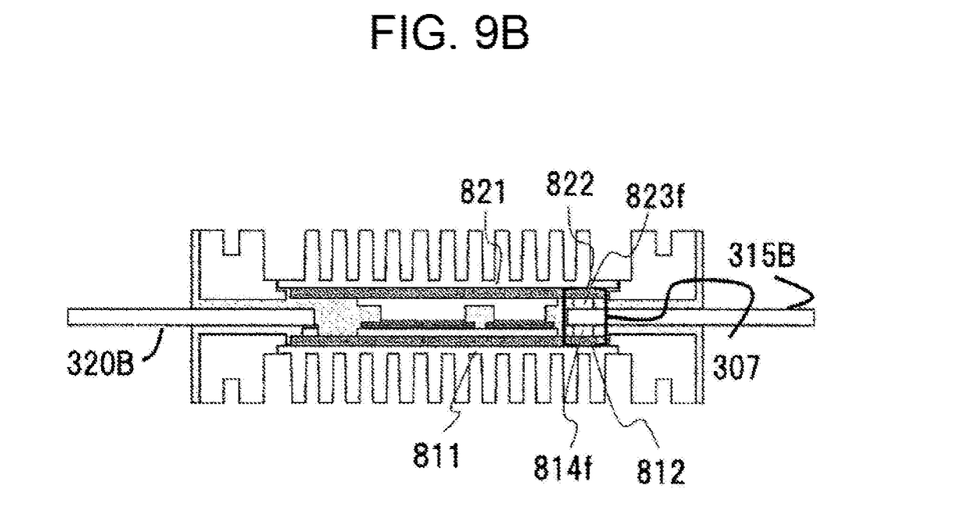
FIG. 9B is a sectional view of a power semiconductor device according to still another embodiment.

FIG. 9(b) is a sectional view of a power semiconductor device according to still another embodiment. The distance between a first base 811 and a second base 821 can be constantly retained by a distance regulation portion 307.

The distance regulation portion 307 according to the present embodiment is formed of a first insulation 812, a conductive portion 813f formed at the first insulation 812, a direct-current terminal 315B, a conductive portion 823f formed at a second insulation 822, and the second insulation 822. Note that a terminal, such as a direct-current terminal 319B or an alternating-current terminal 320B, may be provided instead of the direct-current terminal 315B. According to the present embodiment, the terminal functions as part of the distance regulation portion 307, so that increase in the number of components and increase of the device in size can be inhibited.

Figure 9C:
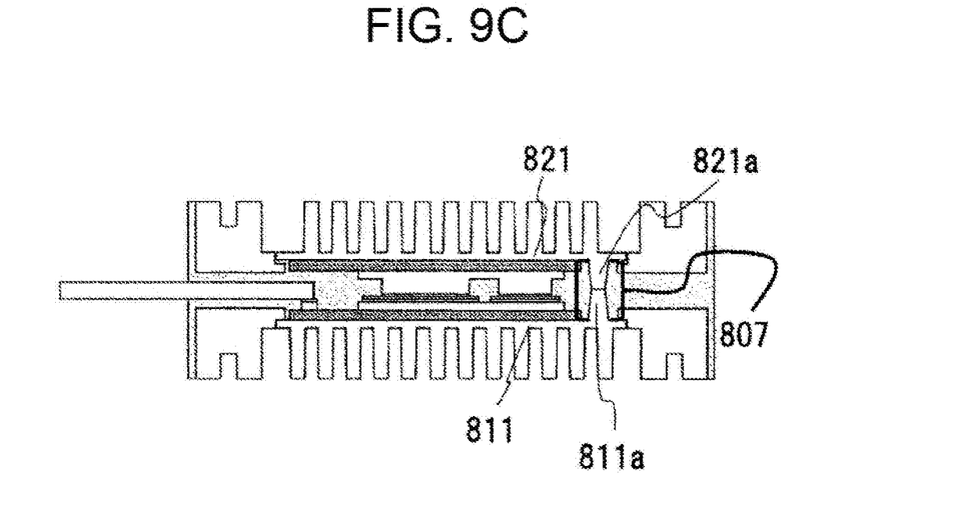
FIG. 9C is a sectional view of a power semiconductor device according to yet another embodiment.

FIG. 9(c) is a perspective view of a power semiconductor device according to yet another embodiment. The distance between a first base 811 and a second base 821 can be constantly retained by a distance regulation portion 407.

The distance regulation portion 407 is formed of a first protrusion 811a protruding from the first base 811 and a second protrusion 821a protruding from the second base 821. The first protrusion 811a may be integrally formed with the first base 811. The second protrusion 821a may be integrally formed with the second base 821. Reduction of the number of members in the distance regulation portion 407 enables reduction of dimensional tolerance or improvement in reliability against destruction such as a crack.

Figure 10:
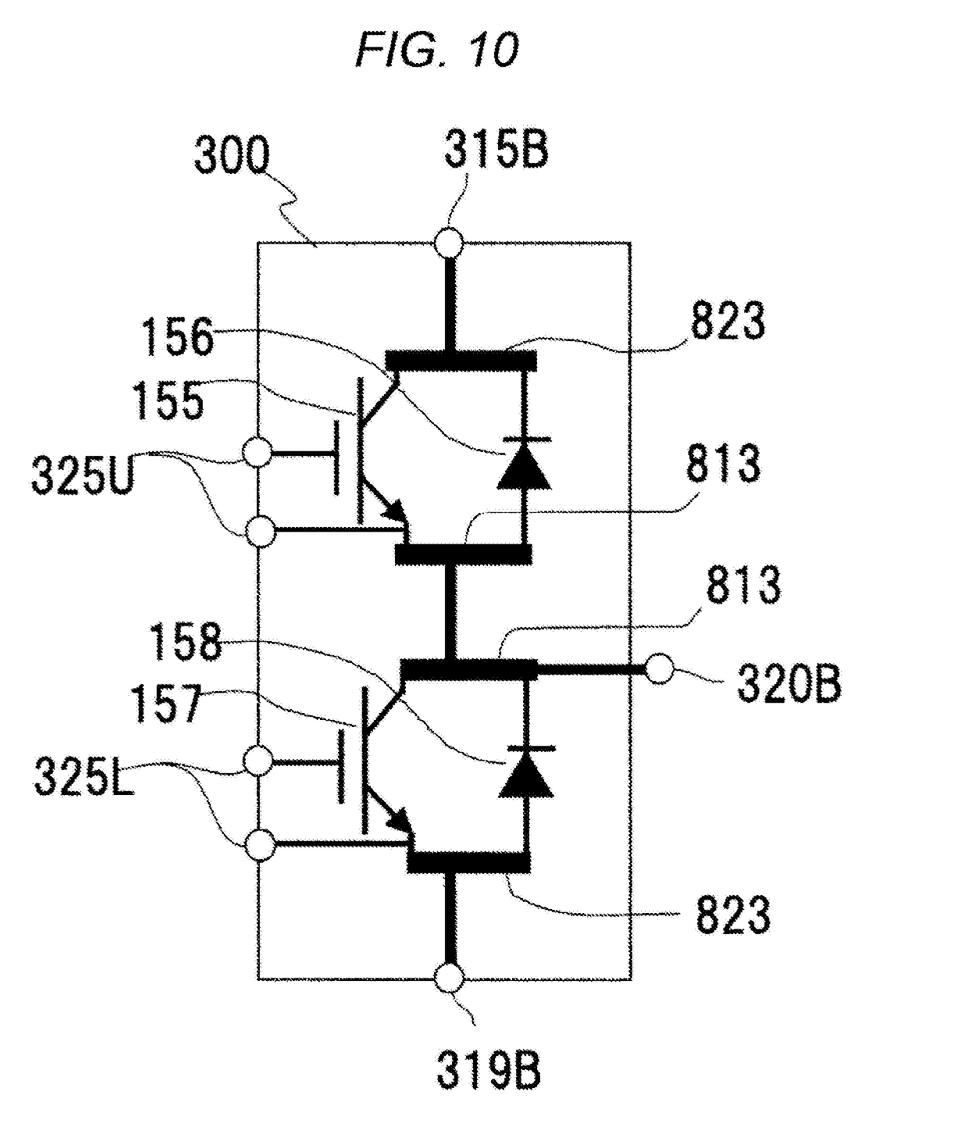
FIG. 10 is a circuit diagram of the power semiconductor device illustrated in any of FIGS. 1 to 9.

FIG. 10 is a circuit diagram of any of the power semiconductor devices illustrated in FIGS. 1 to 9.

The direct-current terminal 315B is output from the collector side of the upper-arm circuit, and is to be connected to the positive electrode side of a battery or a capacitor. The signal terminal 325U is output from the gate and the emitter sense of the IGBT 155 in the upper-arm circuit.

The direct-current terminal 319B is output from the emitter side of the lower-arm circuit, and is to be connected to the negative electrode side of the battery or the capacitor, or GND. The signal terminal 325L is output from the gate and the emitter sense of the IGBT 157 of the lower-arm circuit. The alternating-current terminal 320B is output from the collector side of the lower-arm circuit, and is to be connected to a motor. In a case where neutral grounding is made, the lower-arm circuit is to be connected to the negative electrode side of the capacitor instead of GND.

The power semiconductor device according to the present embodiment has a 2-in-1 structure in which two arm circuits of the upper-arm circuit and the lower-arm circuit are integrated into one module. Use of a 3-in-1 structure, a 4-in-1 structure, or 6-in-1 structure is used instead of the 2-in-1 structure, enables miniaturization with reduction of the number of output terminals from the power semiconductor device.

Figure 11:
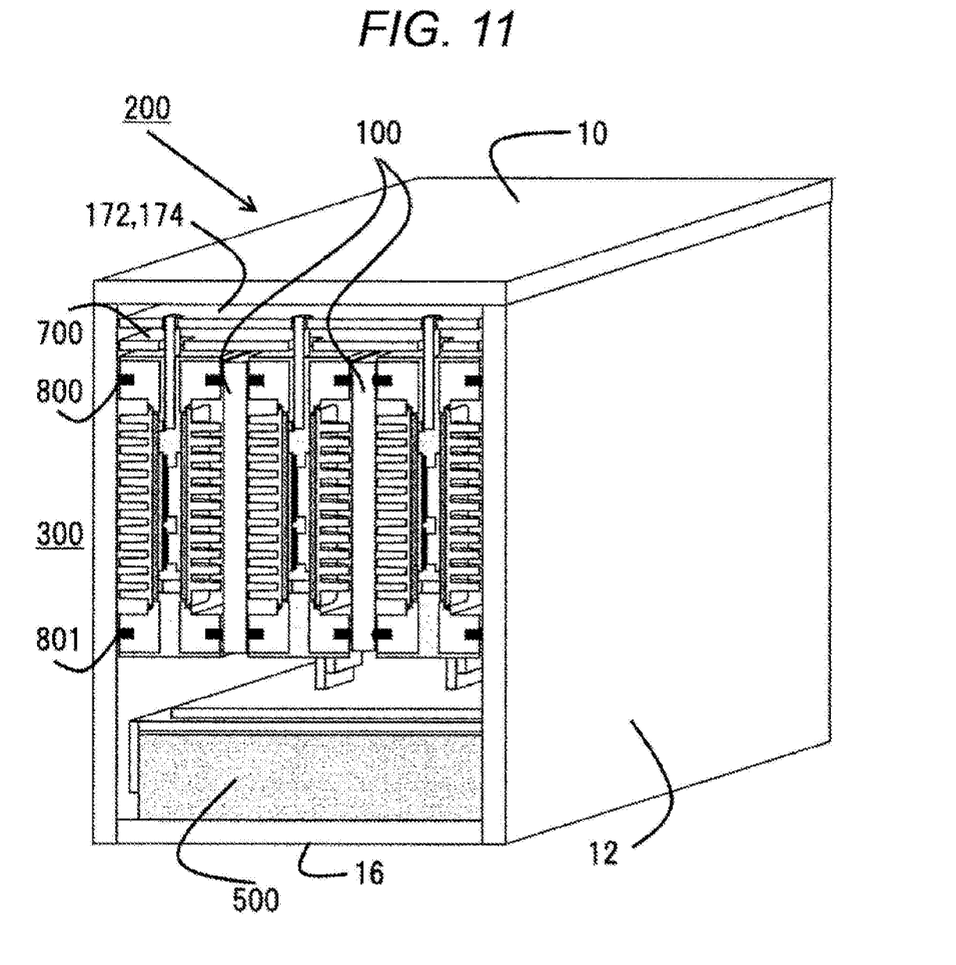
FIG. 11 is a sectional perspective view of a power conversion apparatus 200 equipped with power semiconductor devices 300 according to the present embodiment.

FIG. 11 is a sectional perspective view of a power conversion apparatus 200 equipped with power semiconductor devices 300 according to the present embodiment.

The external appearance of the power conversion apparatus 200 according to the present embodiment is formed of a housing 12 having a top face or a bottom face that is substantially rectangular, an upper case 10 provided at the outer circumference on a short side of the housing 12, and a lower case 16 for covering a lower opening of the housing 12.

Each power semiconductor device 300 is installed in a structure including the housing 12 and a flow-channel formation 100, resulting in formation of a flow channel. After insertion of each power semiconductor device 300, a stacked-electrode lead frame 700 is assembled inside. Then, the alternating-current terminal 320B and the stacked-electrode lead frame are welded together.

Next, a control circuit 172 and a driver circuit 174 equipped with mount components, are assembled inside, resulting in connection with, for example, the signal terminal 325U. The direct-current terminals located at the lower portion of each power semiconductor device 300 are welded to a capacitor module 500. After that, the lower case 16 and the upper case 10 are equipped. Installation of the control circuit at the upper portion and the capacitor module at the lower portion with the power semiconductor devices 300 arranged closely, enables compact arrangement and miniaturization. Each of the sealing portions 800 and 801 of each power semiconductor device 300 is provided with an elastic body, such as an O ring.

REFERENCE SIGNS LIST 10 upper case
12 housing
16 lower case
155A IGBT
155B IGBT
156A diode
156B diode
157A IGBT
157B IGBT
158A diode
158B diode
200 power conversion apparatus
207 distance regulation portion
300 power semiconductor device
307 distance regulation portion
315B direct-current terminal
319B direct-current terminal
320B alternating-current terminal
325L signal terminal
325U signal terminal
325S signal terminal
800 sealing portion
801 sealing portion
804 power semiconductor element
805 case
805a to 805c through hole
805d spacer
806 bent portion
807a to 807f distance regulation portion
809 welded portion
810 collector-side substrate
811 first base
811a first protrusion
812 first insulation
813 conductive portion
813a conductive portion
813b conductive portion
813c conductive portion
813d conductive portion
813e conductive portion
813f conductive portion
820 emitter-side substrate
821 second base
821a second protrusion
822 second insulation
823 conductive portion
823a conductive portion
823b conductive portion
823c first projection
823d second projection
823e conductive portion
823f conductive portion
830 tie bar
831 tie bar 832 tie bar
840 Al wire
841 connection member
850 sealant resin
860 base

The invention claimed is:

1. A power semiconductor device comprising:
a circuit body including a semiconductor element and a conductive portion;
a first insulation and a second insulation opposed to each other, the circuit body being interposed between the first insulation and the second insulation;
a first base and a second base opposed to each other, the circuit body, the first insulation, and the second insulation being interposed between the first base and the second base;
a case having a first opening portion covered with the first base and a second opening portion covered with the second base; and
a distance regulation portion having a first end that contacts the first base and a second end, that is opposite to the first end, and that contacts the second base, the distance regulation portion regulating a distance between the first base and the second base, wherein
a first distance is a distance from the first base to the second base in a region where the distance regulation portion is provided,
a second distance is a distance from a first connecting portion between the first base and the first opening to a second connecting portion between the second base and the second opening, and
the first distance is greater than the second distance.

2. The power semiconductor device according to claim 1, wherein
the first insulation and the second insulation are respective ceramic substrates, and
the distance regulation portion protrudes from the ceramic substrates.

3. The power semiconductor device according to claim 1, wherein
the protrusion has: a first protrusion formed at the first base, the first protrusion protruding to the second base; and a second protrusion formed at the second base, the second protrusion protruding to the first base, and
the first protrusion regulates the distance between the first base and the second base, in contact with the second protrusion.

4. The power semiconductor device according to claim 1, wherein
the first base or the second base has a bent portion deformed to a side on which the case is disposed, the bent portion being in connection with the case.

5. The power semiconductor device according to claim 1, wherein
the first base or the second base has a resin sealant embedded in space between the first base or the second base and the case.

6. A power semiconductor device comprising:
a circuit body including a semiconductor element and a conductive portion;
a first insulation and a second insulation opposed to each other, the circuit body being interposed between the first insulation and the second insulation;
a first base and a second base opposed to each other, the circuit body, the first insulation, and the second insulation being interposed between the first base and the second base;
a case having a first opening portion covered with the first base and a second opening portion covered with the second base; and
a distance regulation portion provided in space between the first base and the second base, the distance regulation portion regulating a distance between the first base and the second base in contact with the first base and the second base, wherein
the first insulation and the second insulation are respective ceramic substrates, and
the distance regulation portion protrudes from the ceramic substrates.

7. The power semiconductor device according to claim 6, wherein
the protrusion has: a first protrusion formed at the first base, the first protrusion protruding to the second base; and a second protrusion formed at the second base, the second protrusion protruding to the first base, and
the first protrusion regulates the distance between the first base and the second base, in contact with the second protrusion.

8. The power semiconductor device according to claim 6, wherein
the first base or the second base has a bent portion deformed to a side on which the case is disposed, the bent portion being in connection with the case.

9. The power semiconductor device according to claim 6, wherein
the first base or the second base has a resin sealant embedded in space between the first base or the second base and the case.

* * * * *